United States Patent
Vincent

(10) Patent No.: US 11,532,532 B2
(45) Date of Patent: Dec. 20, 2022

(54) COMPOSITE MEDIA PROTECTION FOR PRESSURE SENSOR

(71) Applicant: NXP USA, Inc., Austin, TX (US)

(72) Inventor: Michael B. Vincent, Chandler, AZ (US)

(73) Assignee: NXP USA, INC., Austin, TX (US)

( * ) Notice: Subject to any disclaimer, the term of this patent is extended or adjusted under 35 U.S.C. 154(b) by 400 days.

(21) Appl. No.: 16/406,996

(22) Filed: May 8, 2019

(65) Prior Publication Data
US 2020/0357715 A1 Nov. 12, 2020

(51) Int. Cl.
| | | |
|---|---|---|
| B81C 1/00 | (2006.01) |
| H01L 23/31 | (2006.01) |
| H01L 23/29 | (2006.01) |
| H01L 23/367 | (2006.01) |
| H01L 21/56 | (2006.01) |
| G01L 19/06 | (2006.01) |
| H01L 23/00 | (2006.01) |

(52) U.S. Cl.
CPC ...... *H01L 23/3135* (2013.01); *B81C 1/00285* (2013.01); *G01L 19/0645* (2013.01); *H01L 21/565* (2013.01); *H01L 23/295* (2013.01); *H01L 23/315* (2013.01); *H01L 23/3121* (2013.01); *H01L 23/3675* (2013.01); *H01L 24/48* (2013.01); *H01L 2224/48091* (2013.01); *H01L 2224/48106* (2013.01); *H01L 2224/48225* (2013.01); *H01L 2224/48245* (2013.01); *H01L 2924/1461* (2013.01)

(58) Field of Classification Search
CPC ... B81C 1/00277–00293; B81B 7/0035–0041; B81B 7/0058; H01L 2224/48245; H01L 2224/48106; H01L 24/48; H01L 2224/48225; H01L 2924/1461
See application file for complete search history.

(56) References Cited

U.S. PATENT DOCUMENTS

| | | | |
|---|---|---|---|
| 6,674,172 B2 * | 1/2004 | Vincent | H01L 21/563 257/777 |
| 2005/0184382 A1 * | 8/2005 | Chen | B81C 1/00285 257/698 |
| 2014/0022745 A1 * | 1/2014 | Ehrenpfordt | B81B 7/0058 361/749 |
| 2016/0023894 A1 * | 1/2016 | Xu | B81C 1/00269 257/415 |
| 2016/0130136 A1 * | 5/2016 | Singh | B81C 1/00309 257/415 |
| 2020/0031661 A1 * | 1/2020 | Miclaus | B81B 7/0058 |

* cited by examiner

*Primary Examiner* — Selim U Ahmed
*Assistant Examiner* — Evan G Clinton

(57) ABSTRACT

Embodiments for a packaged semiconductor device and methods of making are provided herein, where a packaged semiconductor device includes a package body having a recess in which a pressure sensor is exposed; a polymeric gel within the recess that vertically and laterally surrounds the pressure sensor; and a protection layer including a plurality of beads embedded within a top region of the polymeric gel.

20 Claims, 10 Drawing Sheets

COMPOSITE MEDIA PROTECTION FOR PRESSURE SENSOR

BACKGROUND

Field

This disclosure relates generally to packaged pressure sensor devices, and more specifically, to protection of circuitry from media contamination.

Related Art

Pressure sensors are utilized in a variety of applications, such as in a tire pressure monitoring system (TPMS) for a vehicle. TPMS pressure sensors may be packaged with a radio frequency transmitter that is configured to transmit real-time tire pressure information from the pressure sensor to a main TPMS control unit, which in turn provides an indication (e.g., a warning) to a driver of the vehicle regarding the tire pressure information.

BRIEF DESCRIPTION OF THE DRAWINGS

The present invention may be better understood, and its numerous objects, features, and advantages made apparent to those skilled in the art by referencing the accompanying drawings.

The present invention is illustrated by way of example and is not limited by the accompanying figures, in which like references indicate similar elements, unless otherwise noted. Elements in the figures are illustrated for simplicity and clarity and have not necessarily been drawn to scale.

DETAILED DESCRIPTION

The following sets forth a detailed description of various embodiments intended to be illustrative of the invention and should not be taken to be limiting.

Overview

Conventional packaged pressure sensor devices may be implemented using a laminate substrate or lead frame like a QFN (quad flat no-lead). A hollow housing may be formed from mold compound around a pressure sensor on the QFN or substrate, which may be filled with gel to protect the pressure sensor. The pressure sensor is configured to measure pressure in a surrounding environment, where the gel transmits the pressure to the pressure sensor. However, exposing the gel to the environment includes exposing the gel to media, such as chemical substances that introduce contaminants to the gel, such as fuels, transmission fluid, motor oil, salt water, chlorinated water, and the like. When such media directly contacts the gel, the media can diffuse through the gel and cause corrosion and damage to electronic components in the gel.

The present disclosure provides a composite media protection layer at the interface between the gel and the surrounding environment. A composite media protection layer may be formed from introducing a plurality of beads into a top region of the gel, where the beads reduce the exposed surface area of the gel. By reducing the area of the gel that media may directly contact, the composite media protection layer (also referred to as a protection layer) reduces the amount of media that may diffuse into the gel. Further, channels are formed through the beads, where any media that does diffuse into the gel must travel a longer path before reaching electronic components in the gel, which reduces the rate of media diffusion through the gel. By reducing the amount of media that contacts and diffuses into the gel and reducing the rate of media diffusion through the gel, the protection layer reduces the probability of corrosion and damage to electronic components in the gel.

Example Embodiments

Figure 1:
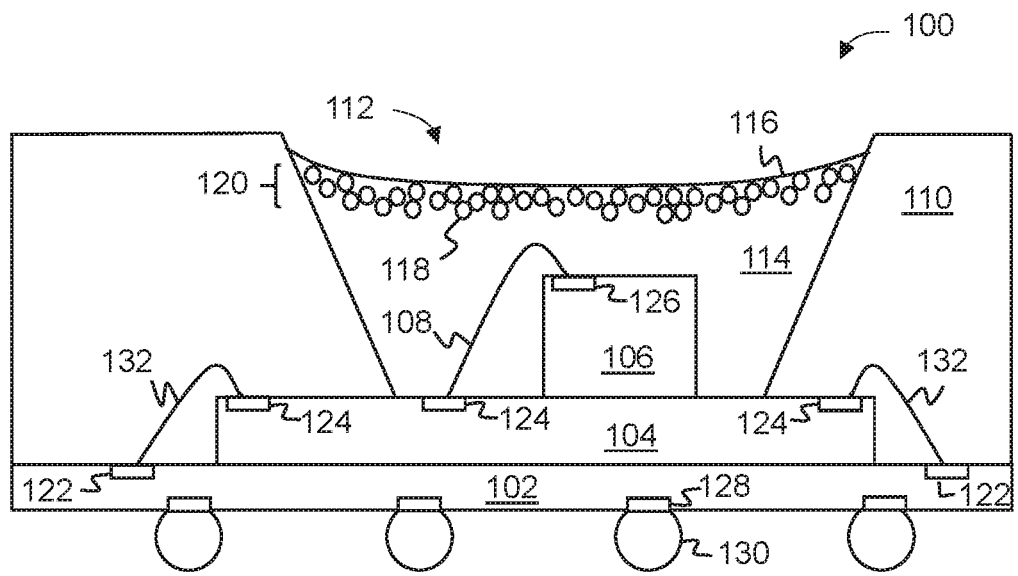
FIGS. 1, 2, and 3 are block diagrams depicting example packaged semiconductor devices that implement a composite media protection layer, according to some embodiments of the present disclosure.

FIG. 1 shows a cross-sectional view of an example packaged pressure sensor device 100 (also referred to as device 100), which includes a composite media protection layer. Device 100 includes a substrate 102, a semiconductor die 104, and a pressure sensor 106, with a number of interconnecting wire bond connections 108 and 132. The pressure sensor 106 is located within a cavity or recess 112 formed within a mold body 110 (also referred to as a package body 110), where the pressure sensor 106 is covered (vertically and laterally surrounded) by a polymeric gel 114. A composite media protection layer 120 (also referred to as a protection layer 120) is formed from a plurality of beads 118 embedded within polymeric gel 114, preferably near a top surface 116 of the polymeric gel 114. These components are further discussed below.

Figure 2:
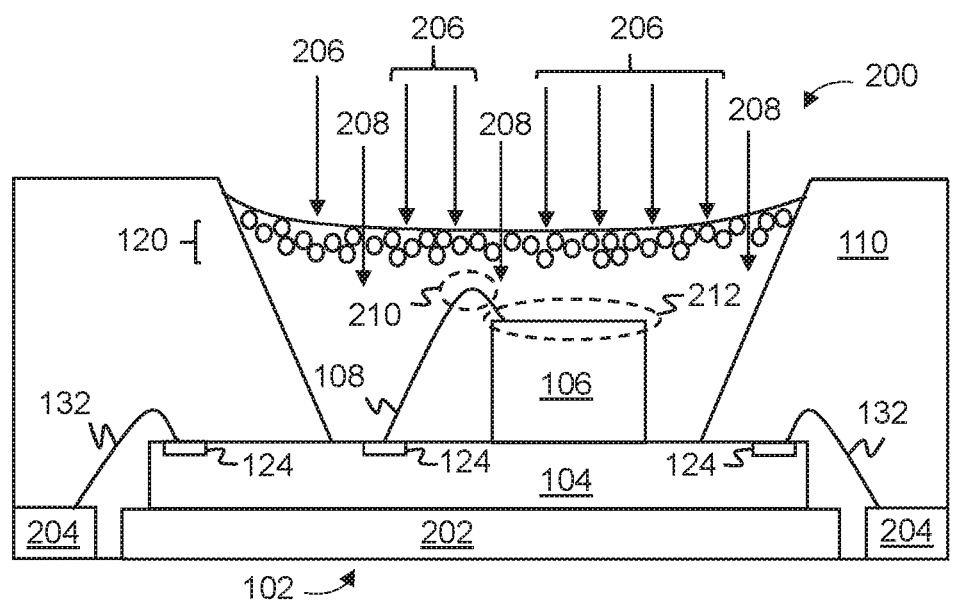

Substrate 102 provides mechanical support and electrical connections for one or more electronic components, such as die 104 and pressure sensor 106. In the embodiment shown in FIG. 1, substrate 102 is a laminate substrate, which is made of a number of dielectric layers and conductive layers to form conductive structures through the substrate, including substrate pads 122 that provide electrical connection contact surfaces on a top surface of substrate 102 (also shown as top surface 304 in FIG. 4) and substrate pads 128 for external connections 130 (e.g., solder balls) on a bottom surface of substrate 102 (also shown as bottom surface 302 in FIG. 4). In other embodiments, substrate 102 may be a lead frame having a die flag 202 and a number of leads 204 that provide electrical connection contact surfaces on one or more top surfaces of leads 204, as shown in FIG. 2. One or more bottom surfaces of leads 204 may also provide external connections. The substrate 102 in the various embodiments described herein may be either a laminate substrate or a lead frame.

Semiconductor die 104 (or simply die 104) includes active circuitry implemented on semiconductor material using a plurality of process steps (e.g., on a semiconductor wafer that is singulated into a plurality of die 104), where the remaining semiconductor material behind or underneath the active circuitry is generally referred to as bulk silicon. The active circuitry is implemented on an active side of the die 104 (also shown as active side 308 in FIG. 4) and the bulk silicon is implemented on an opposite back side of the die 104 (also shown as back side 306 in FIG. 4). The active circuitry includes interconnects to die pads 124, which provide electrical connection contact surfaces on the active side of the die 104. While the portion of the die 104 behind or underneath the active circuitry is referred to as bulk silicon, this portion (and the entire semiconductor die 104) can be any semiconductor material or combinations of materials, such as gallium arsenide, silicon germanium, silicon-on-insulator (SOI), silicon, monocrystalline silicon, the like, and combinations of the above.

Pressure sensor 106 is configured to measure pressure in an environment and output a pressure measurement signal that corresponds to a pressure reading. Pressure sensor 106 may be a MEMS (microelectromechanical structure) device implemented in semiconductor material using a plurality of process steps (e.g., on a semiconductor wafer that is singulated into a plurality of pressure sensors 106). In some embodiments, the pressure sensor is implemented as a capacitive transducer having a capacitive value that changes with pressure-induced displacement between capacitive plates within the transducer, where the transducer converts the capacitive value into the pressure measurement signal. In other embodiments, the pressure sensor is implemented as a piezo-resistive transducer having a resistive value that changes with pressure-induced strain on piezo-resistive elements within the transducer, where the transducer converts the resistive value into the pressure measurement signal. Pressure sensor 106 has at least one contact pad 126 configured to output the pressure measurement signal, which is shown on a top surface of pressure sensor 106 (also shown as top surface 312 in FIG. 6). Contact pad 126 provides an electrical connection contact surface for the pressure sensor 106. Other embodiments may include additional contact pads 126 for bidirectional communication.

Figure 6:
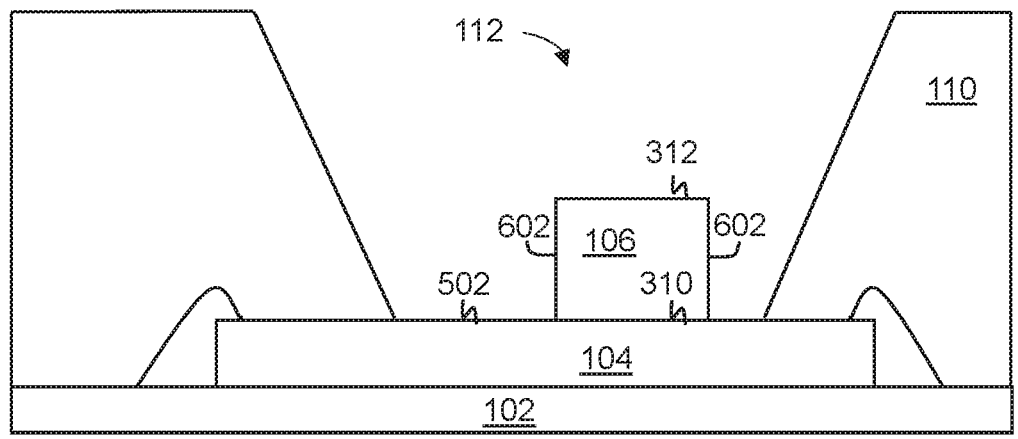

Pressure sensor 106 also has a bottom surface (shown as bottom surface 310 in FIG. 6). In the embodiments shown herein, the bottom surface of pressure sensor 106 is attached to the active side of die 104, where die 104 is in an active side up orientation (or face up orientation) and the active side of die 104 includes a sensor attachment area without any die pads 124 (e.g., a depopulated area) to which pressure sensor 106 is attached. In other embodiments, pressure sensor 106 may instead be directly attached to the substrate 102 (e.g., to a laminate substrate or to a die flag of a lead frame) in a similar manner as die 104 (e.g., pressure sensor 106 and die 104 are lateral to one another instead of stacked). However, attachment of pressure sensor 106 to the active side of die 104 may be preferred to achieve a smaller overall device footprint. Die attach material with adhesive properties may be used to attach the pressure sensor 106 to die 104 (or to substrate 102) and to attach the die 104 to substrate 102. Examples of die attach material include but are not limited to polymer adhesives, solder alloys, polyimides, silicone or epoxy-resin based material containing suspended filler such as carbon nanotubes, or beryllium oxide, aluminum nitride, boron nitride, or diamond powders, pastes, films, tailored die cut tapes, and the like.

Wire bond connections 132 are formed between the various electrical connection contact surfaces of substrate 102 (e.g., top surfaces of substrate pads 122 or leads 204) and die 104 (e.g., top surfaces of die pads 124), and wire bond connections 108 are formed between the various electrical connection contact surfaces of the die 104 and pressure sensor 106 (e.g., top surfaces of contact pads 126). For example, a wire bond connection 132 is formed between a die pad 124 of die 104 and a substrate pad 122 of substrate 102 (as shown on left and right sides of FIG. 1), which may be used to provide a signal connection or a power connection. Similarly, wire bond connections 132 are shown in FIG. 2 between a die pad 124 of die 104 and a lead 204 of the lead frame. As another example, a wire bond connection 108 is formed between contact pad 126 of pressure sensor 106 and a die pad 124 of die 104 (as shown in the center of FIG. 1 and FIG. 2), which provides the pressure measurement signal output by pressure sensor 106 to active circuitry of the die 104. While one wire bond connection 108 is shown in FIG. 1, wire bond connection 108 is representative of a plurality of wire bond connections 108 that may be connected between the pressure sensor 106 and the die 104, including when die 104 and pressure sensor 106 are located side by side. Wire bond connections 132 are similarly representative of a plurality of wire bond connections 132 that may be connected between the substrate 102 and the die 104.

Mold body 110 is formed from an encapsulant material that provides mechanical support and protection for the device 100. Examples of encapsulant material include but are not limited to a mold compound based on a biphenyl type or multi-aromatic type epoxy resin, which may or may not include fibers or filler to provide reinforcement (e.g., glass fiber) or other beneficial aspects (e.g., thermal, physical, or electrical properties) of the mold body. Mold body 110 is generally formed over the substrate 102 and wire bond connections 132 and around the die 104, with a recess or cavity 112 present within the mold body 110 that exposes the pressure sensor 106 and any wire bond connections 108 connected to the pressure sensor 106 (e.g., any wire bond connections 108 connected between the pressure sensor 106 and the die 104). In the embodiments discussed herein, the recess 112 may be directly formed within the mold body 110 by using film assisted molding (FAM) techniques, as further discussed below in connection with FIG. 5. In order to minimize any stress or tension placed on the pressure sensor 106 that may affect the pressure measurement signal, the resulting sidewalls of the recess 112 are spaced apart from sidewalls of the pressure sensor 106 and any wire bond connections 108 connected to the pressure sensor 106 (shown as minimum lateral spacing distance 702 in FIG. 7). Recess 112 is further discussed below in connection with FIG. 5.

Recess 112 is filled with polymeric gel 114, which covers and surrounds pressure sensor 106 and any wire bond connections 108 within the recess 112. Polymeric gel 114 has an internal crosslinked network within a liquid, where the crosslinked network may result from physical bonds or chemical bonds. The amount of crosslinking determines the viscosity of the polymeric gel 114, where the polymeric gel 114 may be injected into the recess 112 in a low viscosity form (which is also referred to as an uncured form, a low crosslinked form, or a liquid form) and cured into a high viscosity form (also referred to as a cured form, a high crosslinked form, or a gel form), as further discussed below in connection with FIG. 8-9. As the viscosity of the gel 114 increases during the curing process, the density of the gel 114 also increases (e.g., the volume of the gel 114 decreases). Once cured, polymeric gel 114 has a low modulus (e.g., less than 1 mega Pascal), which allows the gel 114 to be deformed elastically or non-permanently by pressure from the environment and is flexible enough to transmit pressure from the environment to the pressure sensor 106. Examples of polymeric gel 114 include but are not limited to a polydimethylsiloxane (e.g., silicone) or other silicone based gel, such as a fluorosilicone gel.

Figure 9:
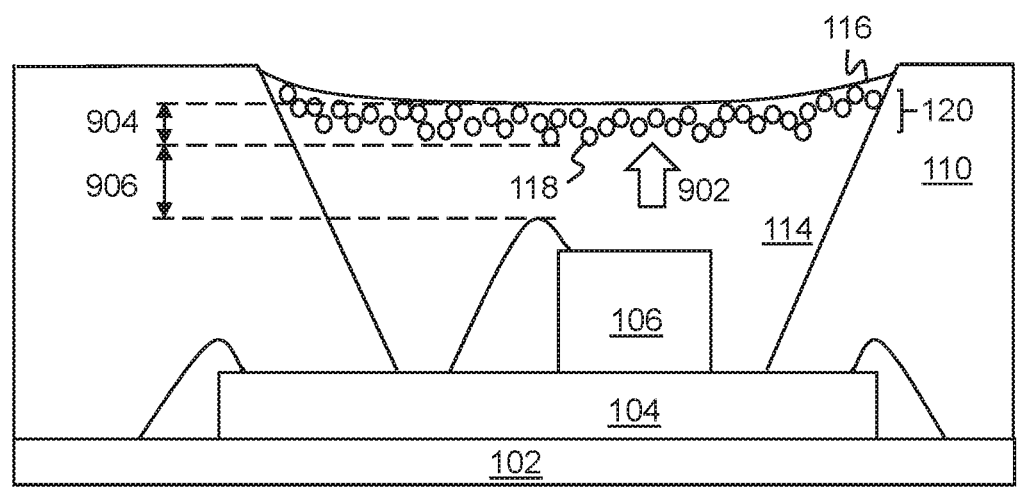

Protection layer 120 is formed at or near the top surface 116 of polymeric gel 114, also referred to as a top region of the polymeric gel 114 (shown as top region 904 in FIG. 9). Protection layer 102 is formed from a plurality of beads 118 that are substantially uniformly distributed laterally across the top region of the polymeric gel 114. Beads 118 are self-arranged within the top region, where beads 118 travel through the gel 114 (e.g., floating or sinking) to a respective position as the gel 114 is cured, as further discussed below. As the crosslinked network of the gel 114 becomes highly viscous during curing, the movement of the beads 118 becomes limited, and completion of the curing process embeds the beads 118 in the top region of the gel 114.

Beads 118 include a material that is generally impermeable to media penetration, or is at least less permeable to media than the gel 114 (e.g., a material that has a slower rate of media diffusion than the gel), such as hollow glass spheres or metal-coated polymer microspheres, where such materials are further discussed below. Beads 118 are located closely together, preferably in physical contact with one another, to act as a physical barrier to media. In some embodiments, beads 118 may have a uniform size, a uniform shape, or both. In other embodiments, beads 118 may be a mixture of differently sized beads, differently shaped beads, or both. Depending on the shape and size of the beads 118, small gaps or spacings filled with gel 114 may be present between beads 118, even when beads 118 are in contact with one another. The gap or spacing between at least two beads may also be referred to as an interstitial volume between beads 118, where the interstitial volume or gap may be located between two or more generally laterally adjacent beads (e.g., two beads positioned side-by-side, even if not positioned within the same horizontal plane), generally vertically adjacent beads (e.g., two beads positioned one over the other, even if not positioned within the same vertical plane), or both. These gaps may be reduced by increasing the concentration of beads to create multiple strata within protection layer 120.

Figure 3:
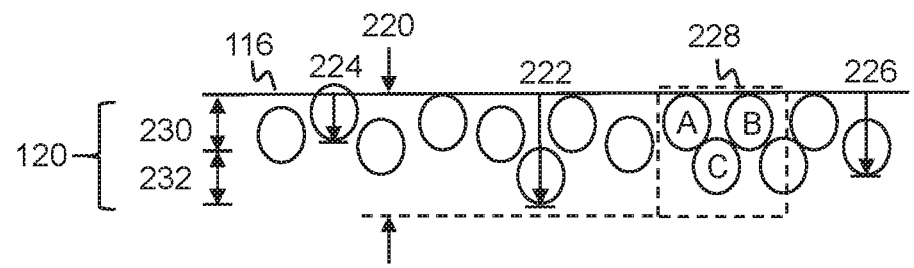

For example, an embodiment that implements beads 118 having a uniform size and uniform shape is shown in FIG. 3. Two beads A and B are shown within dashed box 228 near the top surface 116 with a small interstitial volume or gap in between, which region is generally referred to as an upper strata 230. A third bead C is located in a lower strata 232 under the two beads to block the small gap, which minimizes the size of the gaps through which media may travel. Since the beads 118 are self-arranged, each location of the beads 118 cannot be dictated, but vibration or other physical movement may be introduced during the curing process (e.g., vibrating the device structure or the mold chase within which the device structure is located) to encourage beads 118 of lower strata 232 to position themselves in the gaps between beads 118 of upper strata 230, forming an interlocking network of beads 118. Such physical movement may also encourage a uniform distribution of beads 118 laterally across the entirety of the top region 904 of gel 114, which minimizes the likelihood of large gaps between beads 118.

In some embodiments, strata 230 and 232 each have a depth that corresponds to an average diameter or thickness of the beads 118, where the depths add up to the overall thickness 220 of protection layer 120. For example, the strata 230 and 232 may be equal to three quarters of the bead diameter when the bead shapes are likely to closely interlock with one another (e.g., spheres that may fit in the interstitial volumes or gaps between other spheres in an upper strata, such as bead C fitting in close to beads A and B within the gap between beads A and B), or may be equal to the bead diameter when the bead shapes may interlock less closely (e.g., boxes at various rotations in the gel that may interlock less closely within the gaps between boxes in an upper strata).

Figure 20A:
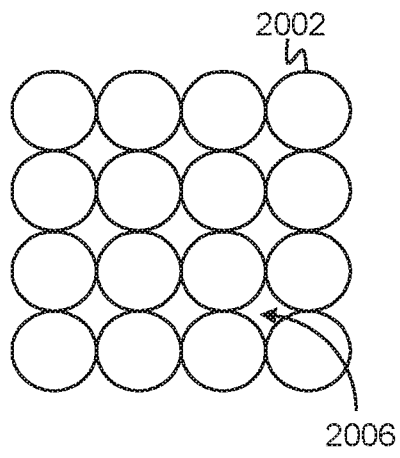
FIGS. 20A, 20B, and 20C are block diagrams depicting an example configuration of a composite media protection layer, according to some embodiments of the disclosure.
Figure 20B:
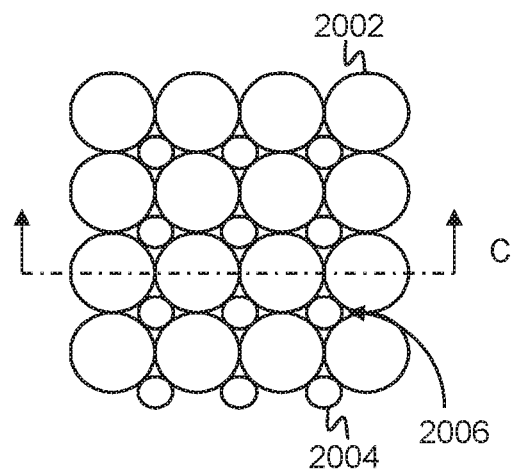
Figure 20C:
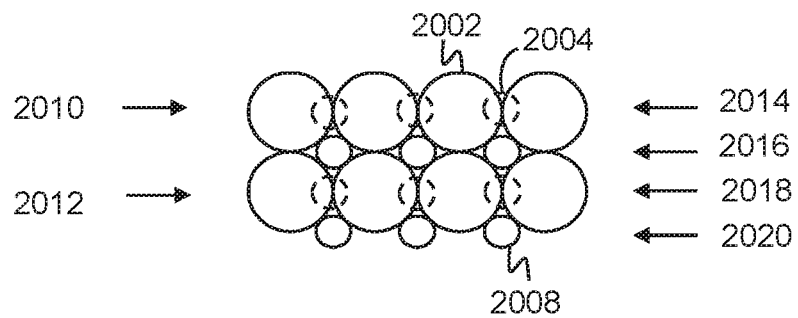

FIGS. 20A, 20B, and 20C show aspects of an example bead arrangement that may be implemented in the protection layer 120 using a mixture of large beads 2002 having a first diameter and small beads 2004 having a second diameter, where the first diameter is larger than the second diameter. The small beads 2004 may have a diameter that is well suited to fitting in the gaps 2006 between each of the large beads 2002, allowing the beads 2002 and 2004 to closely interlock with one another. Additional beads of different sizes, different shapes, or both, may be included in other embodiments. FIG. 20A shows a top down view of an ideal bead arrangement of large beads 2002 in a first layer or strata that are closely situated to one another with interstitial volume or gaps 2006 between the beads 2002 (e.g., the ideal bead arrangement achieves a maximum concentration of large beads 2002 in a given amount of space with minimally sized gaps 2006). FIG. 20B shows a top down view of the ideal bead arrangement of large beads 2002 with a number of small beads 2004 having a size comparable to the size of the gaps 2006. The small beads 2004 fill in the gaps 2006 in the first layer or strata and further increase the overall concentration of beads in the bead arrangement, resulting in reduced permeability of the protection layer 120.

FIG. 20C shows a cross-sectional view of a bead arrangement that implements multiple strata. In the embodiment shown in FIG. 20C, the bead arrangement implements two strata 2010 and 2012 of large beads 2022, with four strata 2014, 2016, 2018, and 2020 of small beads 2002 and 2008 in between. The embodiment shown in FIG. 20C may also be described as two instances of the bead arrangement shown in FIG. 20B, with the addition of two strata 2016 and 2020 of small beads 2008. Small beads 2004 shown in dashed outline in FIG. 20C correspond to the small beads 2004 shown in the top down view of FIG. 20B, where the locations of small beads 2004 are laterally adjacent to large beads 2002 and "behind" the view shown in FIG. 20C (e.g., in the gaps 2006 formed between laterally adjacent large beads 2002 shown in FIGS. 20A and 20B). Small beads 2008 shown in solid outline in FIG. 20C have dimensions (e.g., shape and size) corresponding to small beads 2004, but are located below large beads 2002 within gaps between beads of strata 2010 and strata 2012. In other words, strata 2014 of small beads 2004 is within a same plane as strata 2010 of large beads 2002, strata 2016 of small beads 2008 is between the strata 2010 and 2012 of large beads 2002, strata 2018 of small beads 2004 is within a same plane as strata 2012 of large beads 2002, and strata 2020 of small beads 2008 are below strata 2012 of large beads 2002. While the bead arrangement shown in FIG. 20C may be ideal, a similar arrangement of small beads interspersed between large beads may be achieved by introducing movement, such as vibration, to the beads during curing to encourage the smaller beads 2004 and 2008 to position themselves in gaps 2006 between the larger beads 2002.

In some embodiments, beads 118 have one or more of a uniform shape and a uniform size (e.g., a uniform diameter), although beads having different shapes, sizes, diameters, or any combination thereof may be implemented in other embodiments. A desired overall thickness 220 may be achieved by a desired bead concentration, where a minimum bead concentration achieves an adequately dense arrangement of the beads 118. For example, a minimum bead concentration may be defined as at least 75% of a unit volume within the top region is filled with beads 118, where the unit volume is based on the vertical dimension or thickness 220 of the desired protective layer 120 (e.g., a unit volume equal to the vertical dimension 220 cubed, also shown in cross-sectional view of FIG. 3 as dashed box 228). As another example, a minimum bead concentration may be defined as at least 75% of beads 118 within a unit volume contact at least one other bead (or put in the negative, less than 25% of beads within a unit volume do not contact any other beads). Generally, as the concentration of beads within the top region increases, protection layer 120 achieves smaller gaps between beads (also referred to as pores), narrower channels, or both, which decreases the amount of media penetration. Further, while two strata are shown in FIG. 3, additional strata may be implemented by increasing the bead concentration.

Beads 118 may be located at various depths within the top region 904, preferably within strata 230 and 232, where depth is measured as the distance from top surface 116 to a bottom edge of the bead in FIG. 3, but could also be measured from top surface 116 to a top edge or to a center point of the bead in other examples. For example, depth 222 is shown in FIG. 3 for a bead located within the lower strata 232, and depth 224 is shown for a bead located within the upper strata 230. It is noted that beads in the upper strata 230 may not necessarily be completely covered by gel 114, but may be exposed through the top surface 116 of gel 114, depending on various factors, such as density of the beads 118 and the gel 114, the viscosity of the gel 114 at the time the beads 118 are introduced to the gel 114, and the like. Beads 118 may also have depths at any point within gel 114, such as depth 226 for a bead that "straddles" or is located partially in strata 230 and 232. As noted above, since the beads 118 are self-arranged, each location of the beads 118 cannot be dictated, but vibration or other physical movement may be introduced during the curing process to encourage beads to have a vertical distribution greatest near surface 116, which may also decrease with depth in order to avoid beads 118 being embedded while in contact with wire bond connections 108 or pressure sensor 106 within the gel 114. Beads 118 may be any suitable shape, examples of which include but are not limited to spheres, hollow spheres, cylindrical shapes, hollow cylindrical shapes, rectangular box shapes, hollow rectangular box shapes, toroidal shapes, and the like. Beads 118 may also have any suitable size, although the fabrication method used to form the protection layer 102 may limit the size, as further discussed below in connection with FIG. 8-9 and FIG. 11-12.

It is noted that the embodiments discussed herein implement various example electronic components, while additional electronic components may also be included in other embodiments. In some embodiments, device 100 may further include a temperature sensor for additional readings used to calibrate the pressure readings, a gyroscope sensor for additional sensor data, or an antenna used to communicate data to another device. A separate power source such as a battery (not shown) may be included in some embodiments to power the packaged semiconductor device 100.

The active circuitry of die 104 may include signal processing circuitry that is configured to receive and calibrate the pressure measurement signal in order to output accurate pressure readings. For example, signal processing circuitry may include linearization circuitry configured to improve linearity in the pressure measurement signal, temperature correction circuitry configured to adjust the pressure measurement signal (e.g., when pressure is temperature dependent), or additional circuitry with configurable settings (e.g., configurable gain for a signal amplifier or configurable monitoring thresholds for a signal monitor) to further adjust the pressure measurement signal to output accurate pressure readings. In some embodiments, the pressure readings may be output at an external connection 130.

In some embodiments, the active circuitry of die 104 may include a radio frequency (RF) block that implements an RF transmitter, where an antenna on the device 100 is configured to transmit sensor data, including pressure readings, to a main control unit. For example, the device 100 and the main control unit may be implemented in a tire pressure monitoring system (TPMS) for a vehicle, where pressure sensor 106 is used to monitor tire pressure of a given tire on the vehicle. The sensor data received by the TPMS main control unit may be used by a vehicle control system, such as a driver assistance system, to provide information or warnings to the driver (e.g., low tire pressure warning). In some embodiments, the sensor data transmitted to the main control unit also includes temperature readings or additional data. In some embodiments, sensor data may also include a unique identifier or serial number of the pressure sensor 106, which may be associated with a location of the pressure sensor 106 (e.g., a particular tire on a vehicle).

In some embodiments, the RF block may also implement an RF receiver, providing transceiver functionality for bidirectional communication between the RF block and the main control unit. The RF block implements front end components of the RF transmitter, RF receiver, or both, where the front end components may include but are not limited to a transmitter power amplifier, a receiver low noise amplifier, one or more baluns, one or more filters, a circulator or other coupling device to the antenna, impedance matching elements, an oscillator, a phase locked loop, and other appropriate front end elements. The front end components of the RF block may have configurable settings to adjust the output signal that conveys the sensor data. In some embodiments, the RF block may have an operating frequency that falls within a frequency band of 300 to 500 MHz, although other operating frequencies that fall within other radio frequencies may be implemented in other embodiments.

The active circuitry may further implement control logic configured to control the signal processing and RF block. For example, control logic may adjust the configurable settings of the signal processing circuitry, the RF block, or both to achieve accurate pressure readings. In embodiments where the RF block implements an RF receiver, the control logic may receive information from the main control unit that is used to control the configurable settings of the signal processing circuitry, RF block, or both.

FIG. 2 shows a device 200 implemented with a lead frame as substrate 102, which includes a die flag 202 and leads 204. A representative configuration of the lead frame is shown in FIG. 2, while other embodiments may include differently configured lead frames, such as where the leads 204 may extend past the lateral perimeter of mold body 110, or the die flag 202 may be positioned in a different plane than the leads 204, or the die flag 202 may be covered by mold body 110. Device 200 similarly includes die 104, pressure sensor 106, wire bond connections 108 and 132, mold body 110, recess 112, gel 114, and protection layer 120, as discussed above.

FIG. 2 also shows example paths of possible media diffusion. As noted above, the pressure sensor 106 of the packaged pressure sensor device 200 is configured to measure pressure in an environment, where the top surface 116 of gel 114 is exposed to the environment and transmits pressure from the environment to the pressure sensor 106. Such environmental exposure may also allow media exposure to the gel 114. Media may be any chemical substance that may cause corrosion or damage to the device, which may alter performance of the device. Examples of media include but are not limited to fuels, transmission fluid, motor oil, salt water, chlorinated water, soapy water, acidic liquids, and the like. When such media directly contacts the exposed surface 116 of gel 114, the media can diffuse through the gel 114 and expose electronic components within the gel 114 to contaminants that may cause corrosion and damage. Electronic components closest to the surface 116 of gel 114 are at greater risk for such media exposure. Some example risk areas are indicated by dashed lines, such as an upper portion 210 of any wire bond connection 108 within the gel 114, and an upper portion 212 of the pressure sensor 106.

Generally, protection layer 120 reduces the exposed portions of surface 116 of gel 114 through which media may diffuse, which reduces the amount of media that may contact and diffuse into gel 114 and ultimately reach risk areas 210 and 212. As noted above, depending on the shape and size of the beads 118 used to implement protection layer 120, small gaps filled with gel 114 may be present between beads 118, even when beads 118 are in contact with one another. These gaps between beads 118 in the upper strata 230 form pores at surface 116, which may connect with gaps between beads 118 in the lower strata 232 to form channels of gel 114 through the protection layer 120.

Media exposure to device 200 is represented by arrows 206 and 208. In the example shown, most of the media is blocked or at least redirected away from surface 116 of gel 114 by protection layer 120, which is shown as media 206. However, some media (shown as media 208) may still diffuse into gel 114 through the exposed portions of surface 116 (or pores between beads). Exposure to media 208 is greatly reduced as compared to a device without a protection layer 120, which would otherwise be exposed to both media 206 and 208. Further, the channels of gel 114 through the protection layer 120 may "wind" around beads 118, forming a longer diffusion path through gel 114 (as compared with a straight or direct path to electronic components within the gel 114), which reduces the rate of media diffusion through gel 114. By reducing the amount of media that contacts and diffuses into gel 114 and reducing the rate of media diffusion through gel 114, the probability of corrosion and damage occurring at risk areas 210 and 212 is reduced. Also, while corrosion and damage may eventually occur, the amount of time in which it occurs may be increased, which therefore increases longevity of the operational use of the device.

Figure 11:
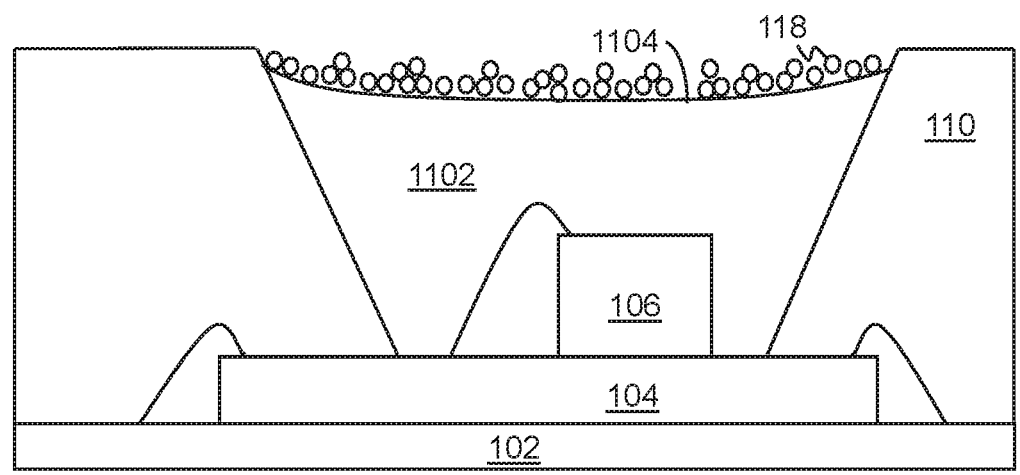
Figure 12:
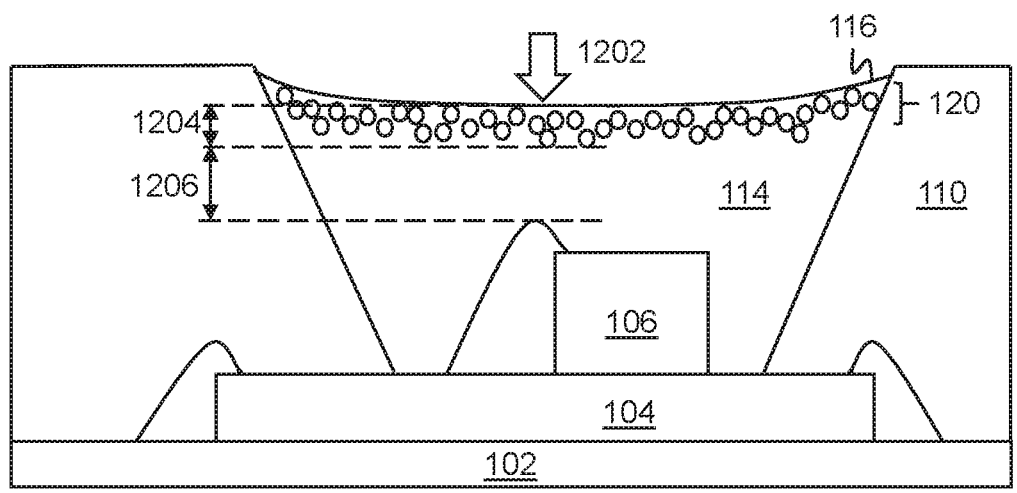
Figure 13:
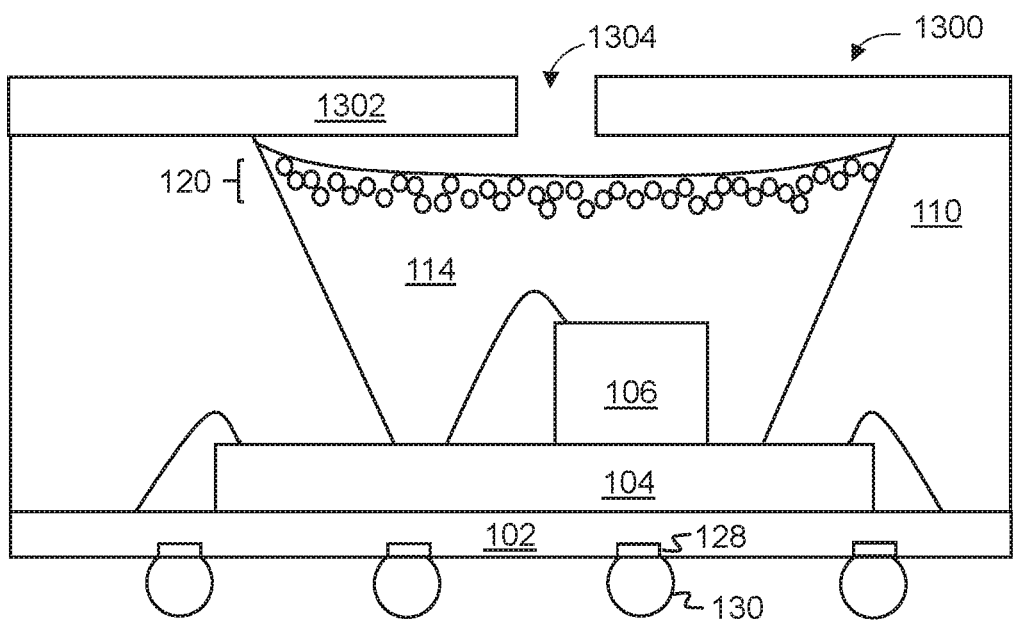
FIG. 13 is a block diagram depicting another example packaged semiconductor device, according to some embodiments of the present disclosure.

FIG. 4-9 and FIG. 10-12 show cross-sectional views of various steps of two example methods performed on a device structure to fabricate a packaged pressure sensor device, with FIG. 13 showing another device embodiment that may be implemented with either method. The intermediate device structures shown in the following figures include the components discussed above, which are representative of components that may be included in different device embodiments, which may have a component layout that differs from that shown in the following figures. In some embodiments, the device structure is implemented in a 9mm by 9mm footprint, which may be differently sized in other embodiments. The single device structure shown in the following figures may be representative of a number of device structures formed as part of an array or reconstituted wafer of device structures that are then singulated into a plurality of packaged devices, where the various steps discussed herein are implemented on all device structures of the array. Pads have also been omitted from the following figures for simplicity's sake.

Figure 4:
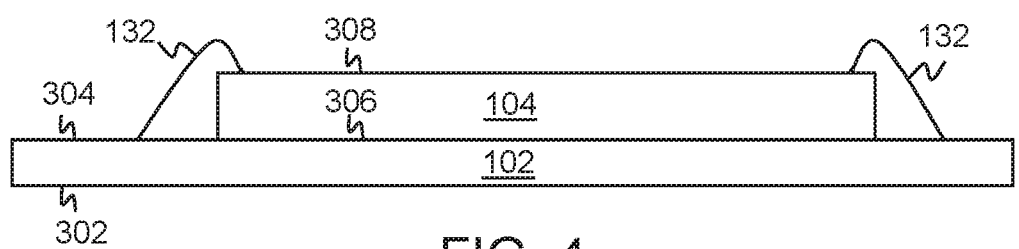
FIGS. 4, 5, 6, 7, 8, and 9 are block diagrams depicting steps of an example process for fabricating a packaged semiconductor device with a composite media protection layer, according to some embodiments of the present disclosure.

FIG. 4 shows an example device structure after an assembly step and wire bonding step. In the embodiment shown, the back side 306 of die 104 is attached to the top surface 304 of substrate 102 (e.g., to a laminate substrate or to a die flag of a lead frame). The active side 308 of die 104 includes a plurality of die pads 124, which are located outside of a depopulated area (e.g., an area without die pads 124) that serves as a pressure sensor attachment area, further discussed below in connection with FIG. 6. Die pads 124 may be arranged in a layout on active side 308 that implements one or more regular patterns, such as rows, or one or more irregular patterns, or both. Wire bond connections 132 are formed between die pads 124 of the die 104 and substrate pads 122 (which may be leads 204 in other embodiments).

Figure 5:
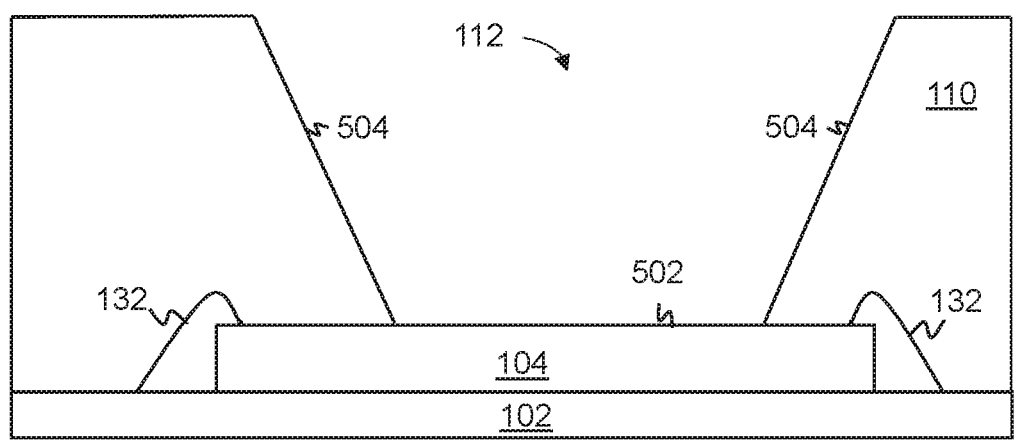

FIG. 5 shows the device structure after an encapsulation step that forms mold body 110 over the substrate 102 and around a portion of die 104. In the embodiment shown, recess 112 is formed concurrently with the mold body 110 by using a FAM technique. For example, the device structure is placed in a mold chase, and a plunger member positions a film in place on the pressure sensor assembly area (within which the pressure sensor 106 will later be placed). In the embodiment shown, pressure sensor assembly area 502 is located on the active side 308 of die 104 and includes both a depopulated area for attachment of the pressure sensor 106 and a populated area that includes die pads 124 on which wire bond connections 108 will be formed. In other embodiments, pressure sensor assembly area 502 may be located on a top surface 304 of the substrate 102 (e.g., on a laminate substrate or on a die flag of a lead frame). In embodiments where pressure sensor 106 is to be placed directly on substrate 102, the pressure sensor assembly area 502 also includes a portion of the active side of die 104 that includes die pads 124 on which wire bond connections 108 will be formed.

The plunger member is large enough to encompass pressure sensor assembly area 502 Area 502 serves as a footprint in which the pressure sensor 106 and any wire bond connections 108 are attached or formed, as further discussed below. The plunger member holds the film in contact with the active side 308 of the die 104, where the film also extends upward within the mold chase, forming boundaries for side walls 504 of the recess 112. As mold compound is injected or otherwise introduced into the mold chase, the film acts a barrier preventing any mold compound from reaching the volume above area 502. The mold compound is then cured or otherwise set to form mold body 110, and the plunger member and film is removed from the resulting recess 112. Once the plunger member is removed, area 402 is exposed within recess 112. For example, in the embodiment shown, recess side walls 504 outline an exposed portion of active side 308. In embodiments where pressure sensor 106 is to be placed directly on substrate 102, side walls 504 may also outline an exposed portion of the top side 304 of substrate 102 (e.g., of a laminate substrate or a die flag 202 of a lead frame). In the embodiment shown, the recess side walls 504 are formed at a positive angle (e.g., angling outward from the center of the recess 112), but may also be formed as vertical side walls in other embodiments. Area 502 is also large enough to ensure a minimum lateral spacing distance 702 will be achieved between the side walls 504 and any anticipated location of electrical components, such as the pressure sensor 106 or any wire bond connections 108, in order to minimize any exposure of the pressure sensor 106 to stress or tension from the rigid mold compound that would otherwise affect the pressure measurement signal of the pressure sensor 106.

FIG. 6 shows the device structure after another assembly step that attaches the pressure sensor 106 to the attachment surface exposed within recess 112. In the embodiment shown, the bottom surface 310 of pressure sensor 106 is attached to the active side 308 of die 104, such as within a depopulated area of active side 308 within area 502. In other embodiments, the bottom surface 310 of pressure sensor 106 may instead be directly attached to the top surface 304 of the substrate 102 (e.g., to a laminate substrate or to a die flag of a lead frame) in a similar manner as die 104 (e.g., pressure sensor 106 and die 104 are lateral to one another instead of stacked). In still other embodiments, the pressure sensor 106 may be formed as a flip-chip type of sensor, where the bottom surface 310 is an active side of the pressure sensor 106 with one or more contact pads 126 that may be attached via bumps or pillars to die pads 124 on the active side 308 of semiconductor die 104, eliminating the need for wire bond connections 108 formed between the pressure sensor 106 and the semiconductor die 104. Generally, pressure sensor 106 has a footprint that is smaller than the footprint of the underlying die 104, and may be attached at any suitable location (or pressure sensor attachment area) on the die 104.

Figure 7:
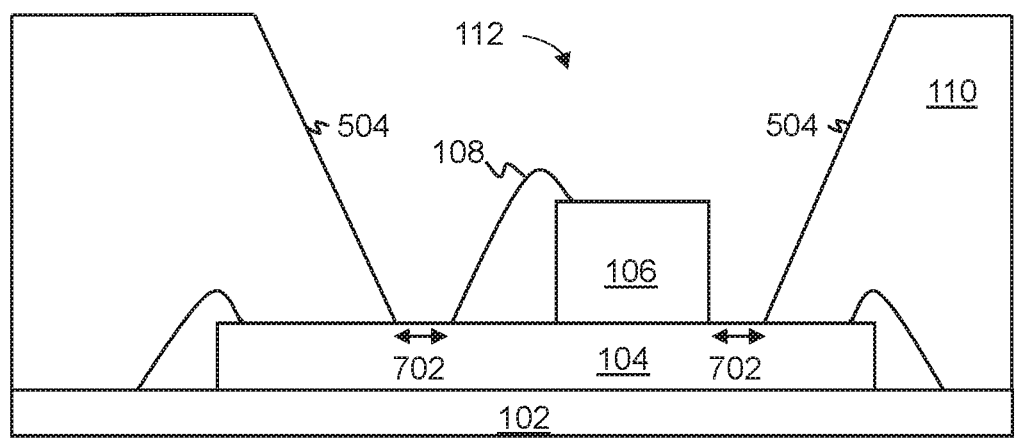

FIG. 7 shows the device structure after another wire bonding step. Wire bond connections 108 are formed between contact pads 126 of the pressure sensor 106 and die pads 124 of the die 104, which are exposed within recess 112. Minimum lateral spacing distance 702 is achieved between the side walls 504 and any electrical components within recess 112, such as the pressure sensor 106 (e.g., side walls 602 of pressure sensor 106) and any wire bond connections 108, in order to minimize any exposure of the pressure sensor 106 to stress or tension from the rigid mold compound that would otherwise affect the pressure measurement signal of the pressure sensor 106.

Figure 8:
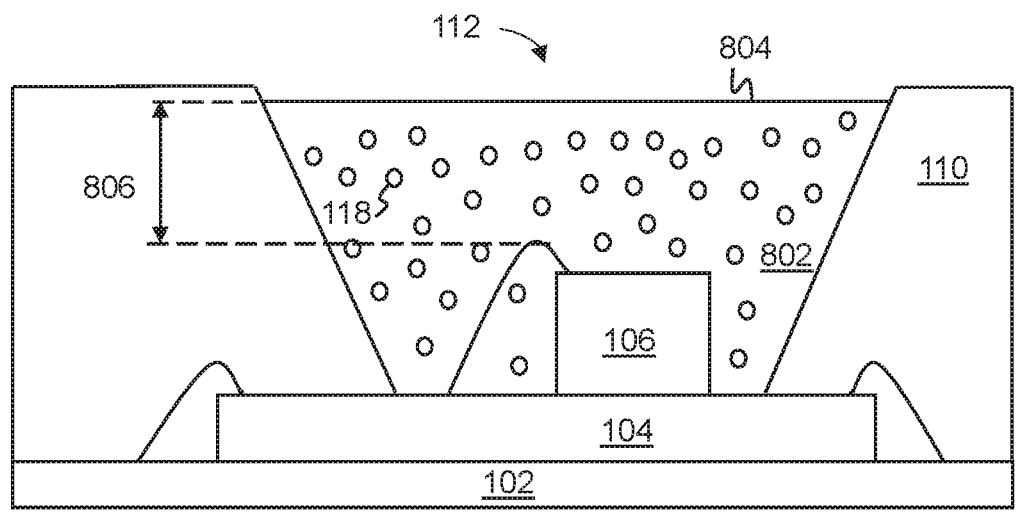

FIG. 8 shows the device structure after a low viscosity form 802 of polymeric gel 114 (also referred to as low viscosity polymeric gel 802 or low viscosity gel 802) is injected or otherwise introduced into the recess 112. In the embodiment shown, a plurality of beads 118 are mixed into the low viscosity gel 802 before gel 802 is injected into the recess 112, resulting in the beads 118 being dispersed throughout the low viscosity gel 802 in the recess 112. In some embodiments, the low viscosity gel 802 has an initial viscosity that reduces movement of the beads 118 through gel 802 until curing begins, as further described below in FIG. 9. The top surface 804 of gel 802 is spaced apart from any electrical components within recess 112, such as wire bond connections 108 or the top surface of pressure sensor 106, by some distance 806 in which the protection layer 120 will be formed and a minimum vertical spacing distance 906 will be achieved, as also further described below in FIG. 9. In other embodiments, the beads 118 may be separately added to the recess 112 after the low viscosity gel 802 is injected into the recess 112, which is further discussed below in connection with FIG. 10-12.

FIG. 9 shows the device structure after curing the low viscosity gel 802 into the high viscosity form of polymeric gel 114 (also referred to as high viscosity polymeric gel 114 or high viscosity gel 114). As noted above, in some embodiments, the low viscosity gel 802 may have a viscosity that reduces movement of the beads 118 until the curing begins. Curing may be temperature dependent, where the polymeric gel (which may be a low viscosity form, an intermediate viscosity form, with beads, or with without beads, or any combination thereof) is cured by exposure to a range of cure temperatures, may be time dependent, where the polymeric gel is cured by exposure to a single cure temperature for a period of time, or may be both temperature and time dependent, where the polymeric gel is cured by exposure to a combination of cure temperatures over different periods of time.

In some embodiments, during an initial stage of curing (e.g., when the device structure is exposed to a first range of curing temperatures, a first period of curing time, or both), the viscosity of gel 802 is reduced, which releases the beads 118 within gel 802. During an intermediate stage of curing (e.g., when the device structure is exposed to a second range of curing temperatures greater than the first range, a second period of curing time, or both), the beads 118 float through gel 802 toward the top surface 804, which movement is shown as arrow 902, due to each bead 118 having a density that is less than the density of the low viscosity gel 802. As time progresses during the intermediate stage, the viscosity of the gel 802 increases as additional crosslinks are formed, reducing the movement of the beads 118. As noted above, movement or vibration may be introduced during the intermediate stage of curing to encourage beads 118 to move toward the top surface 804 and position themselves in the gaps or interstitial volume between beads 118 of upper strata. During a final stage of curing (e.g., when the device structure is exposed to a final range of curing temperatures greater than the second range), bead movement is eventually stopped due to the greater viscosity of the cured gel 114, which embeds the beads 118 in their final positions within the top region 904 of the cured gel 114 and forms protection layer 120, as shown in FIG. 9. As a result of the curing, top surface 116 may be slightly curved (e.g., in a concave manner). Generally, a minimum vertical spacing distance 906 is achieved between the protection layer 120 (e.g., measured from the bottom surface of region 904 within which the protection layer 120 is formed) and any electrical components within the recess 112, such as wire bond connections 108 and the pressure sensor 106, in order to minimize any exposure of the pressure sensor 106 to stress or tension from the protection layer 120 that would otherwise affect the pressure measurement signal of the pressure sensor 106.

The size and shape of the beads 118 may also be limited in the embodiment shown, in order to avoid bead shapes or sizes that may become caught near risk areas as they move toward top surface 804, such as being caught under a row of wire bond connections 108 (e.g., limiting the bead size to be less than the gap between wire bond connections 108, or avoiding bead shapes that are bent or hooked), as well as to avoid possibly clogging the aperture through which the gel 802 and bead 118 mixture is injected into the recess 112 (e.g., limiting the bead size as compared with the size of the aperture or avoiding bead shapes that may cause beads to "latch" onto other beads to form a clog).

As noted above, the beads 118 used in such embodiments generally have a density less than the density of the low viscosity gel 802 before curing, which may be approximately 1 g/cc (e.g., 1.03 g/cc). Examples of materials used to form beads 118 include but are not limited to glass (e.g., density less than or equal to 0.8 g/cc), polystyrene (e.g., density less than or equal to 1.08 g/cc), polyethylene (e.g., density less than or equal to 0.96 g/cc), and other suitable polymer materials. Beads 118 may be formed in any suitable shape (discussed above), such as hollow spheres or toroidal shaped beads. These materials are generally less media permeable than compared to gel 114, which reduces the rate of media diffusion through the material as compared with the rate of media diffusion through the gel 114, and, as a result, provide a better barrier to media than the gel 114 alone. The selection of the bead material may also depend on the melting temperature of the material relative to higher temperatures used during the curing process.

Figure 10:
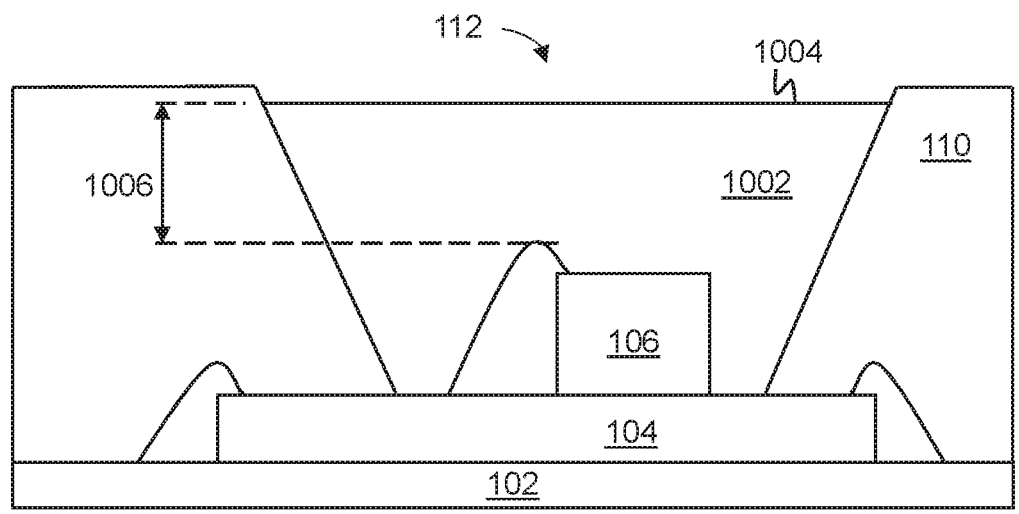
FIGS. 10, 11, and 12 are block diagrams depicting steps of another example process for fabricating a packaged semiconductor device with a composite media protection layer, according to some embodiments of the present disclosure.

FIG. 10-12 show alternative steps for fabricating a packaged pressure sensor device, which may follow after the step shown in FIG. 7 described above. FIG. 10 shows an embodiment of the device structure after a low viscosity form 1002 of polymeric gel 114 (also referred to as low viscosity gel 1002) is injected or otherwise introduced into the recess 112, without any beads 118. The top surface 1004 of gel 1002 is similarly spaced apart from any electrical components within recess 112, such as wire bond connections 108 or the top surface of pressure sensor 106, by some distance 1006 (like distance 806) in which the protection layer 120 will be formed and a minimum vertical spacing distance 1206 (like minimum vertical spacing distance 906) will be achieved, as also further described below in FIG. 12.

FIG. 11 shows the device structure after curing the low viscosity gel 1002 into an intermediate viscosity form 1102 of polymeric gel 114 (also referred to as intermediate viscosity polymeric gel 1102 or intermediate viscosity gel 1102). In some embodiments, the viscosity of low viscosity gel 1002 is initially reduced during an initial stage of curing (e.g., when the device structure is exposed to a first range of curing temperatures), which then increases during an intermediate stage of curing (e.g., when the device structure is exposed to a second range of curing temperatures greater than the first range) to result in intermediate viscosity gel 1102. A plurality of beads 118 are then dispensed or otherwise introduced into the recess 112, such as being poured onto the surface 1104 of intermediate viscosity gel 1102. In some embodiments, beads 118 may have a density greater than the density of the intermediate viscosity gel 1102 and sink into gel 1102, where the intermediate viscosity gel 1102 (e.g., crosslinks formed during the curing process up to this point in time) has a viscosity adequate to prevent the beads 118 from sinking too deeply into the gel 1102 but still allows movement of the beads 118 through gel 1102, as further shown in FIG. 12.

FIG. 12 shows the device structure after beads 118 sink into gel 1102 near the top surface 1104 (which movement is shown as arrow 1202) and the intermediate viscosity gel 1102 is cured into the high viscosity form of polymeric gel 114 (also referred to as high viscosity polymeric gel 114 or high viscosity gel 114) after a final stage of curing (e.g., when the device structure is exposed to a final range of curing temperatures greater than the second range). After beads 118 are introduced to recess 112, movement or vibration may be introduced during the intermediate stage, final stage, or both stages to encourage beads 118 to move toward the top surface 1104 and position themselves in the gaps or interstitial volume between beads 118 of upper strata. Bead movement is eventually stopped due to the increasing viscosity of the cured gel 114 during final curing, which embeds the beads 118 in their final positions within the top region 1204 of the cured gel 114 and forms protection layer 120. Generally, a minimum vertical spacing distance 1206 is achieved between the protection layer 120 (e.g., measured from the bottom surface of region 1204 within which the protection layer 120 is formed) and any electrical components within the recess 112, such as wire bond connections 108 and the pressure sensor 106, in order to minimize any exposure of the pressure sensor 106 to stress or tension from the protection layer 120 that would otherwise affect the pressure measurement signal of the pressure sensor 106.

In such embodiments, since the beads 118 are not moving through the gel in the vicinity of the electronic components, the size and shape of the beads need not be as limited as the size and shape of beads 118 in the embodiments discussed above in connection with FIG. 4-9. However, the timing of adding the beads 118 to the recess 112 during the curing process may be limited in the embodiments discussed in connection with FIG. 10-12, where the beads 118 should be added at some point before the viscosity of the gel 1102 becomes so thick that it prevents movement of the beads 118 into the gel 1102.

In embodiments where the beads 118 are added to intermediate viscosity gel 1102, beads 118 may have a density that is greater than the density of the intermediate viscosity gel 1102, or may have a density that is less than the density of the intermediate viscosity gel 1102. Examples of materials used to form beads 118 include but are not limited to microspheres or other suitable shapes (described above) formed from a polymer material (e.g., polystyrene, polyethylene, and the like), microspheres or other shapes formed from a polymer material and coated with metal (e.g., aluminum, silver, tin, and the like) such as silver coated polymethyl methacrylate (PMMA) microspheres (e.g., density of 1.2 g/cc), as well as hollow glass spheres or glass toroidal shapes (e.g., density less than or equal to 0.8 g/cc), and the like. These materials are generally less media permeable than compared to gel 114, which reduces the rate of media diffusion through the material as compared with the rate of media diffusion through the gel 114, and, as a result, provide a better barrier to media than the gel 114 alone. The selection of the bead material may also depend on the melting temperature of the material relative to higher temperatures used during the final stage of the curing process.

FIG. 13 shows a device 1300, which may be implemented using either fabrication method described above in connection with FIGS. 4-9 and 10-12, and may be implemented using either a laminate substrate or a lead frame. In the embodiment shown, substrate 102 is a laminate substrate with external connections, such as solder balls 130, attached to substrate pads 128. Device 1300 includes protection layer 120 formed in gel 114, as discussed above. Device 1300 also includes a lid 1302 or other protective structure attached to the top surface of mold body 110. Lid 1302 includes a vent hole or an aperture 1304 through which pressure of the environment is exposed to the gel 114, which in turn is transmitted to pressure sensor 106. The device structure shown in FIG. 13 may be an individual device or may be a representative device of an array or panel of devices, which may be formed using a laminate substrate or a lead frame array.

Figure 14:
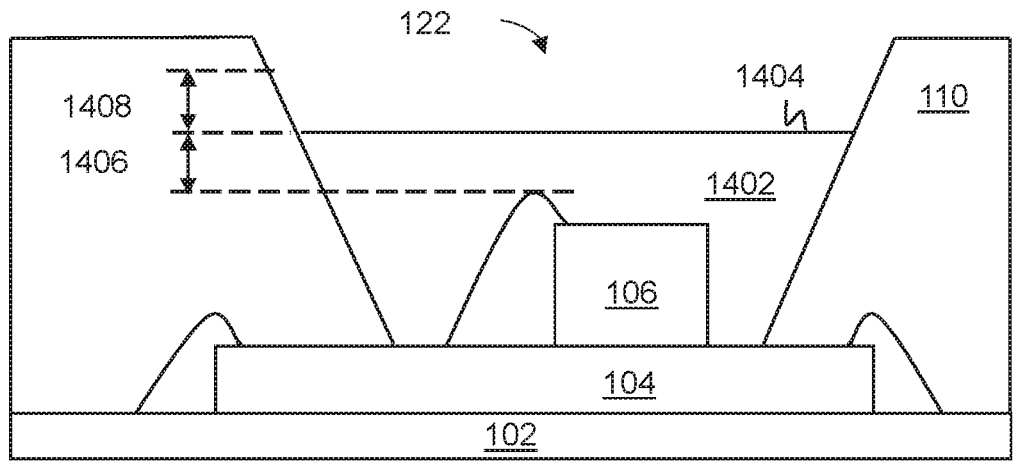
FIG. 14-19 are block diagrams depicting steps of other example processes for fabricating a packaged semiconductor device with a composite media protection layer, according to some embodiments of the present disclosure.
Figure 15:
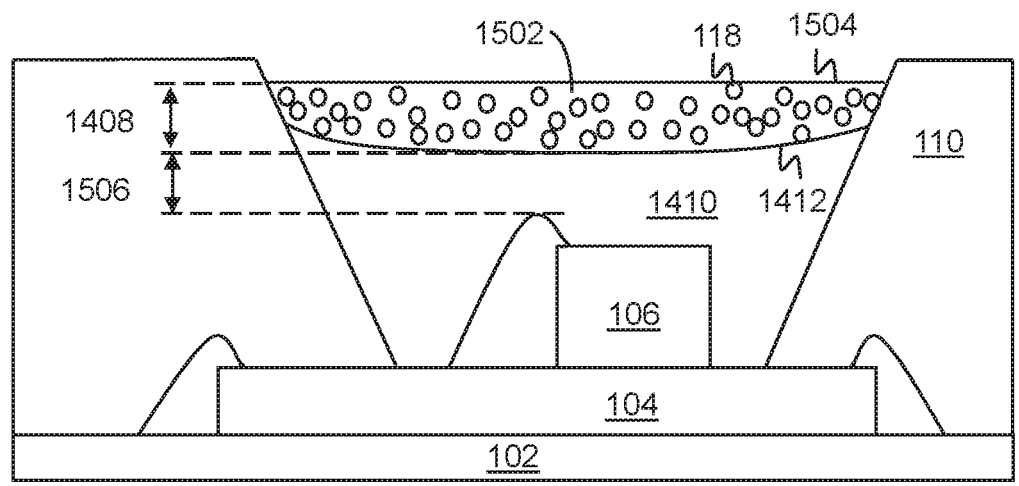
Figure 16:
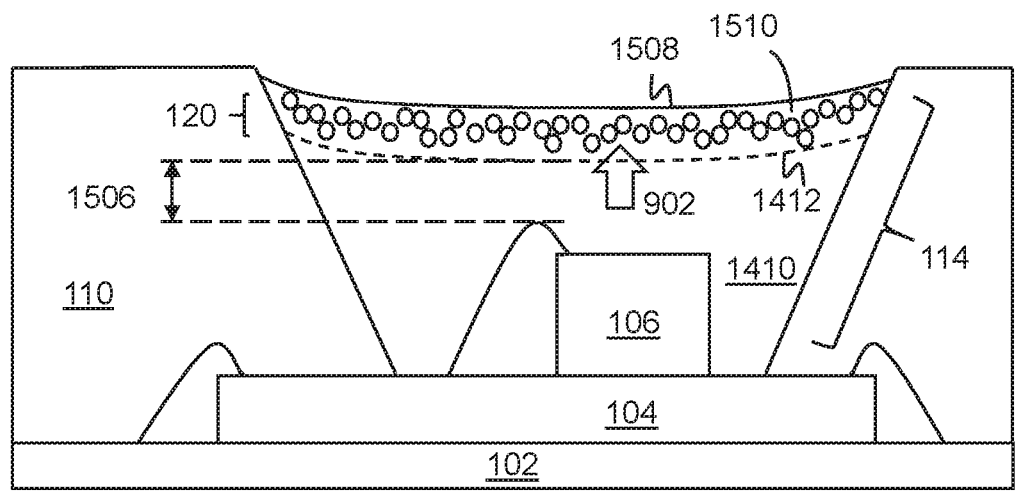

FIG. 14-16 show additional alternative steps for fabricating a packaged pressure sensor device, which may follow after the step shown in FIG. 7, described above. FIG. 14 shows an embodiment of the device structure after a low viscosity polymeric gel 1402 is injected or otherwise introduced into the recess 112, without any beads 118. Less gel 1402 is used than in the example shown in FIG. 8, due to the protection layer 120 being formed in the top region 1408 within the recess 112 as a subsequent step. The top surface 1404 of gel 1402 is spaced apart from any electrical components within recess 112 by some distance 1406, within which a minimum vertical spacing distance 1506 (like minimum vertical spacing distance 906) is achieved, as described in FIG. 15.

FIG. 15 shows the device structure after a first curing process that cures the gel 1402 into a higher viscosity form 1410, which may be similar to an intermediate viscosity gel (like gel 1102) or a high viscosity gel (like gel 114). A minimum vertical spacing distance 1506 between any electronic components within the recess 112 and a top surface 1412 of higher viscosity gel 1410 is achieved once gel 1402 is cured into higher viscosity gel 1410. Top surface 1412 serves as a bottom surface of the region 1408 in which protection layer 120 will be formed. The embodiment shown may be beneficial for ensuring that the minimum vertical spacing distance 1506 is achieved between the protection layer 120 and the electronic components within the recess 112, especially when dimensions of the packaged pressure sensor device become smaller and the minimum vertical spacing distance 1506 becomes critical to avoid any stress or tension from the protection layer 120 being transferred to the electronic components connected to the pressure sensor 106, which would degrade measurement performance of the pressure sensor 106.

FIG. 15 also shows low viscosity gel 1502 injected or otherwise introduced into the top region 1408 within recess 112. In the embodiment shown, a plurality of beads 118 are mixed into the low viscosity gel 1502 before gel 1502 is injected into the recess 112, resulting in the beads 118 being dispersed throughout the gel 1502 in the recess 112. The amount of gel 1502 introduced may adjust the position of top surface 1504 of gel 1502 within the recess 112, allowing additional control over the resulting thickness of the gel in which the protection layer 120 is formed, which affects the concentration of beads 118 within a unit volume of the protection layer 120.

FIG. 16 shows the device structure after a second curing process that cures low viscosity gel 1502 into a high viscosity gel 1510. In embodiments where gel 1410 is an intermediate viscosity gel, the second curing process may also cure gel 1410 into a high viscosity form. Together, cured gels 1410 and 1510 form (cured) polymeric gel 114. As discussed above, the beads 118 arrange themselves in low viscosity gel 1502 (e.g., in response to vibration) to be distributed throughout region 1408 as gel 1502 cures into high viscosity gel 1510. In the embodiment shown, the beads 118 float within low viscosity gel 1502, shown as arrow 902, due to each bead 118 having a density that is less than the density of the low viscosity gel 1502. However, in other embodiments, the beads 118 may have a density greater than low viscosity gel 1502. In such embodiments, beads 118 may distribute themselves over surface 1412 of gel 1410, where gel 1410 has an adequately high viscosity that prevents beads 118 from sinking through gel 1410. In such embodiments, a minimal amount of low viscosity gel 1502 may be used to secure beads 118 in their final positions, rather than requiring the beads 118 to float through low viscosity gel 1502 to their final positions. In embodiments that use a minimal amount of gel 1502, the resulting surface 1508 of cured gel 1510 may closely follow the upper surfaces of the beads 118 (e.g., surface 1508 may not be as smooth as shown, but instead may be "bumpy" due to following the top curved portions of sphere shaped beads 118).

Figure 17:
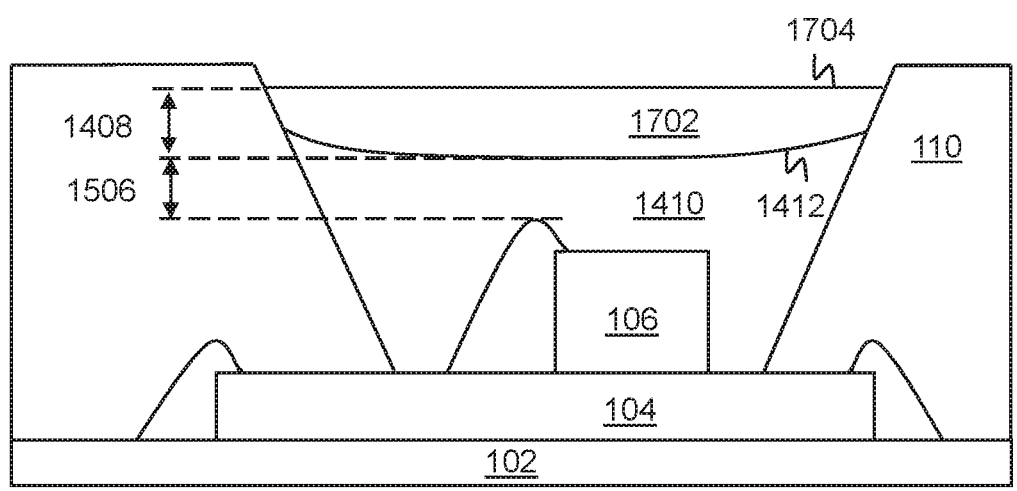
Figure 18:
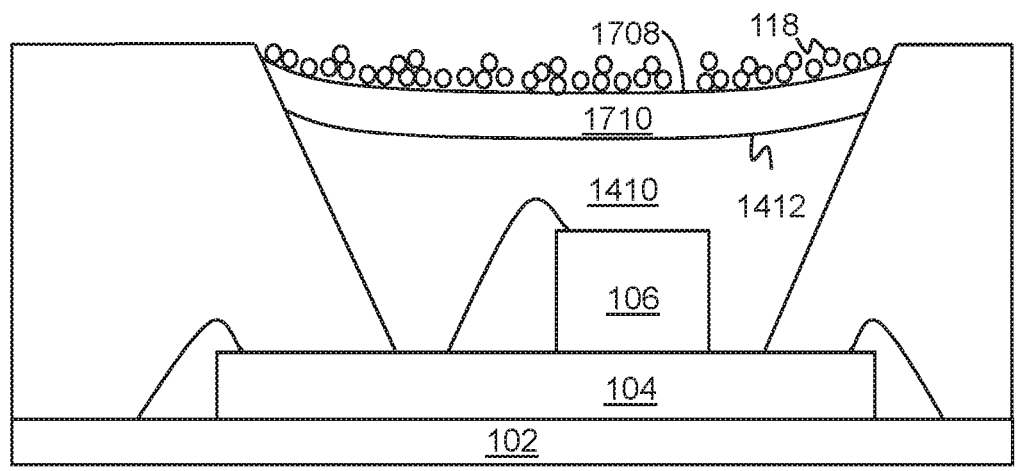
Figure 19:
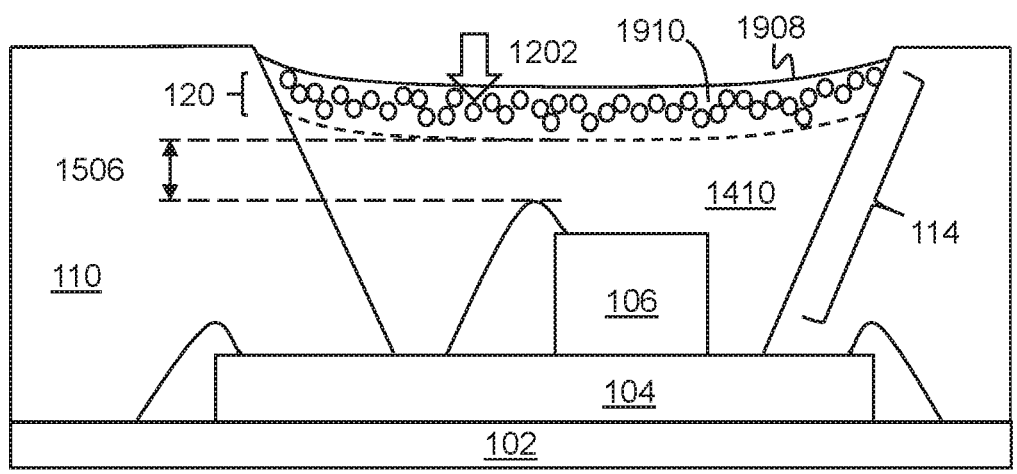

FIG. 17-19 show additional alternative steps for fabricating a packaged pressure sensor device, which may follow after curing the gel 1402 shown in FIG. 14 into a higher viscosity gel 1410, described above. FIG. 17 shows low viscosity gel 1702 injected or otherwise introduced into the top region 1408 within recess 112. In the embodiment shown, gel 1702 does not include any beads 118. The amount of gel 1702 introduced may similarly adjust the position of top surface 1704 of gel 1702 within the recess 112, allowing additional control over the resulting thickness of the gel in which the protection layer 120 is formed, which affects the concentration of beads 118 within a unit volume of the protection layer 120.

FIG. 18 shows the device structure after a plurality of beads 118 have been dispensed or otherwise introduced into the recess 112, where FIG. 18 may be representative of two embodiments. In one embodiment, low viscosity gel 1702 is cured into intermediate viscosity gel 1710, and the plurality of beads 118 are poured onto the surface 1708 of intermediate viscosity gel 1710. In another embodiment, low viscosity gel 1702 is not cured and is labeled as low viscosity gel 1710, and the plurality of beads 118 are poured onto the surface 1708 of low viscosity gel 1710. In both embodiments, beads 118 may have a density greater than the density of the gel 1710 (either as low viscosity gel or intermediate viscosity gel) and sink into gel 1710.

FIG. 19 shows the device structure after a curing process. As discussed above, the beads 118 arrange themselves in gel 1710 (e.g., in response to vibration) to be distributed throughout region 1408 as gel 1710 (either as low viscosity gel or intermediate viscosity gel) cures into high viscosity gel 1910. In the embodiment shown, beads 118 may distribute themselves over surface 1412 of gel 1410, where gel 1410 has an adequately high viscosity that prevents beads 118 from sinking through gel 1410. In embodiments where gel 1410 is an intermediate viscosity gel, the curing process may also cure gel 1410 into a high viscosity form. Together, cured gels 1410 and 1910 form (cured) polymeric gel 114. In some embodiments, a minimal amount of gel 1710 may be used to secure beads 118 in their final positions, where the resulting surface 1908 of cured gel 1910 may closely follow the upper surfaces of the beads 118 (e.g., surface 1908 may not be as smooth as shown, but instead may be "bumpy" due to following the top curved portions of sphere shaped beads 118).

A laminate substrate is made of a number of dielectric layers and conductive layers to form conductive structures through the substrate, which include plating, pads (e.g., pads 122), interconnects, and vias. Such conductive structures are formed from an electrically conductive material, examples of which include but are not limited to nickel, gold, copper, aluminum, or other suitable conductive metal or alloy composed of one or more suitable conductive metals. Electrical connection contact surfaces on the substrate pads may be coated with an electrically conductive material, examples of which include nickel, gold, copper, aluminum, tin, silver, titanium, or other suitable conductive metal or alloy composed of one or more suitable conductive metals in order to improve the "bondable" nature of the substrate pads. Examples of a laminate substrate include, but are not limited to, a ball grid array (BGA), a pin grid array (PGA), and the like. The laminate substrate shown in FIG. 1 may be an individual substrate, or may be a representative substrate in a substrate array or panel that includes a plurality of laminate substrates.

A lead frame is formed from electrically conductive material, examples of which include but are not limited to copper, nickel, or other suitable conductive materials or alloy composed of one or more suitable conductive materials. Electrical connection contact surfaces (and external connections) on the leads may also be coated with an electrically conductive material, examples of which include but are not limited to nickel, gold, copper, aluminum, tin, or other suitable conductive metal or alloy composed of one or more suitable conductive materials in order to improve the "bondable" nature of the leads. The lead frame shown in FIG. 2 may be an individual lead frame, or may be a representative lead frame in a lead frame array that includes a plurality of lead frames.

Semiconductor die 104 (also referred to as simply die 104) may be formed as one of a plurality of die implemented on a semiconductor wafer, which can be implemented using any semiconductor material or combinations of materials, such as gallium arsenide, silicon germanium, silicon-on-insulator (SOI), silicon, monocrystalline silicon, the like, and combinations of the above. The active circuitry of semiconductor die 104 is formed using a sequence of numerous process steps applied to the semiconductor wafer, including but not limited to depositing semiconductor materials including dielectric materials and metals, such as growing, oxidizing, sputtering, and conformal depositing, etching semiconductor materials, such as using a wet etchant or a dry etchant, planarizing semiconductor materials, such as performing chemical mechanical polishing or planarization, performing photolithography for patterning, including depositing and removing photolithography masks or other photoresist materials, ion implantation, annealing, and the like. Examples of integrated circuit components include but are not limited to a processor, memory, logic, analog circuitry, sensor, MEMS (microelectromechanical systems) device, a standalone discrete device such as a resistor, inductor, capacitor, diode, power transistor, and the like. In some embodiments, the active circuitry may be a combination of the integrated circuit components listed above or may be another type of microelectronic device. In some embodiments, the active circuitry includes an LDMOS (laterally diffused metal oxide semiconductor) transistor.

By now it should be appreciated that there has been provided a composite media protection layer at the interface to the surrounding environment, including a plurality of beads suspended within a top region of polymeric gel, which serves as a barrier to media.

In one embodiment of the present disclosure, a packaged semiconductor device is provided, which includes: a package body having a recess in which a pressure sensor is exposed; a polymeric gel within the recess that vertically and laterally surrounds the pressure sensor; and a protection layer including a plurality of beads embedded within a top region of the polymeric gel.

One aspect of the above embodiment provides that the recess has one or more recess sidewalls, and each recess sidewall is separated from an adjacent electronic component located within the recess by at least a minimum lateral spacing distance.

Another aspect of the above embodiment provides that the protection layer is separated from an adjacent electronic component located within the recess by at least a minimum vertical spacing distance.

Another aspect of the above embodiment provides that the plurality of beads are laterally distributed across an entirety of the top region of the polymeric gel.

Another aspect of the above embodiment provides that the protection layer has a minimum bead concentration defined as at least 75% of a unit volume is filled with beads, and the unit volume is equal to a vertical thickness of the protection layer, cubed.

Another aspect of the above embodiment provides that the protection layer has a minimum bead concentration defined as at least 75% of beads within a unit volume contact at least one other bead, and the unit volume is equal to a vertical thickness of the protection layer, cubed.

Another aspect of the above embodiment provides that the protection layer has at least two strata of beads, each strata having a vertical height that corresponds to an average diameter of a bead plurality of beads, and beads in a lower strata are positioned within interstitial openings between beads in an upper strata.

Another aspect of the above embodiment provides that the plurality of beads includes beads formed from a material that has a slower rate of media diffusion than the polymeric gel.

Another aspect of the above embodiment provides that the plurality of beads includes beads formed from at least one of a polymer material and glass.

A further aspect of the above embodiment provides that each bead of the plurality of beads further includes a metal coating.

Another aspect of the above embodiment provides that the plurality of beads includes beads having one or more shapes of a group of shapes including spheres, hollow spheres, cylindrical shapes, hollow cylindrical shapes, rectangular box shapes, hollow rectangular box shapes, and toroidal shapes.

Another aspect of the above embodiment provides that the packaged semiconductor device further includes: a substrate embedded in the package body; and a semiconductor die attached to the substrate and embedded in the package body, wherein the substrate is one of a group including a laminate substrate and a lead frame.

Another aspect of the above embodiment provide that the packaged semiconductor device further includes: a lid attached to a top surface of the package body, wherein the lid includes a vent hole.

In another embodiment of the present disclosure, a method for fabricating a packaged semiconductor device is provided, the method including: assembling a semiconductor die and a substrate as part of a device structure; encapsulating the device structure using film assisted molding to form a mold body having a recess; attaching a pressure sensor to an attachment surface exposed within the recess; injecting a low viscosity polymeric gel into the recess, wherein the low viscosity polymeric gel includes a plurality of beads distributed within the low viscosity polymeric gel; and curing the low viscosity polymeric gel into a high viscosity polymeric gel, wherein the plurality of beads float toward a top surface of the low viscosity polymeric gel as the low viscosity polymeric gel is cured into the high viscosity polymeric gel, and the plurality of beads become embedded in a top region of the high viscosity polymeric gel.

One aspect of the above embodiment provides that a density of each bead of the plurality of beads is less than a density of the low viscosity polymeric gel.

Another aspect of the above embodiment provides that before the curing, the low viscosity polymeric gel has an initial viscosity that reduces movement of the plurality of beads distributed within the low viscosity polymeric gel, and during an initial curing stage, the initial viscosity is reduced to release the plurality of beads distributed within the low viscosity polymeric gel.

Another aspect of the above embodiment provides that the method further includes: during the curing, vibrating the device structure to encourage self-arrangement of the plurality of beads near the top surface of the low viscosity polymeric gel.

In another embodiment of the present disclosure, a method for fabricating a packaged semiconductor device, the method including: assembling a semiconductor die and a substrate as part of a device structure; encapsulating the device structure using film assisted molding to form a mold body having a recess; attaching a pressure sensor to an attachment surface exposed within the recess; injecting a low viscosity polymeric gel into the recess; curing the low viscosity polymeric gel into an intermediate viscosity polymeric gel; dispensing a plurality of beads onto a top surface of the intermediate viscosity polymeric gel, wherein the plurality of beads sink below a top surface of the intermediate viscosity polymeric gel; and curing the intermediate viscosity polymeric gel into a high viscosity polymeric gel, wherein the plurality of beads become embedded in a top region of the high viscosity polymeric gel.

One aspect of the above embodiment provides that a density of each bead of the plurality of beads is greater than a density of the intermediate viscosity polymeric gel.

Another aspect of the above embodiment provides that the method further includes: vibrating the device structure to encourage self-arrangement of the plurality of beads near the top surface of the intermediate viscosity polymeric gel.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

It is noted that the term "neighboring" as used herein means "adjacent to" (e.g., next to and without an intervening object), and "laterally" as used herein means "in a sideways direction" (e.g., a horizontal direction that is parallel to a plane of the substrate).

Also as used herein, the terms "approximately" and "about" mean a value close to or within an acceptable range of an indicated value, amount, or quality, which also includes the exact indicated value itself.

As used herein, the terms "substantial" and "substantially" mean sufficient to achieve the stated purpose or value in a practical manner, taking into account any minor imperfections or deviations, if any, that arise from usual and expected process abnormalities that may occur during device fabrication, which are not significant for the stated purpose or value.

Although the invention is described herein with reference to specific embodiments, various modifications and changes can be made without departing from the scope of the present invention as set forth in the claims below. For example, additional or fewer electronic components may be implemented in FIG. 1. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A packaged semiconductor device comprising:
a package body having a recess in which a pressure sensor is exposed;
a polymeric gel within the recess that vertically and laterally surrounds the pressure sensor; and
a protection layer comprising a plurality of beads embedded within a top region of the polymeric gel;
wherein
the plurality of beads comprises beads formed from at least one of a polymer material and glass,
each bead of the plurality of beads further comprises a metal coating.

2. The packaged semiconductor device of claim 1, wherein
the recess has one or more recess sidewalls, and
each recess sidewall is separated from an adjacent electronic component located within the recess by at least a minimum lateral spacing distance.

3. The packaged semiconductor device of claim 1, wherein
the protection layer is separated from an adjacent electronic component located within the recess by at least a minimum vertical spacing distance.

4. The packaged semiconductor device of claim 1, wherein
the plurality of beads are laterally distributed across an entirety of the top region of the polymeric gel.

5. The packaged semiconductor device of claim 1, wherein
the protection layer has a minimum bead concentration defined as at least 75% of a unit volume is filled with beads, and
the unit volume is equal to a vertical thickness of the protection layer, cubed.

6. The packaged semiconductor device of claim 1, wherein
the protection layer has a minimum bead concentration defined as at least 75% of beads within a unit volume contact at least one other bead, and the unit volume is equal to a vertical thickness of the protection layer, cubed.

7. The packaged semiconductor device of claim 1, wherein
the protection layer has at least two strata of beads, each strata having a vertical height that corresponds to an average diameter of a bead plurality of beads, and
beads in a lower strata are positioned within interstitial openings between beads in an upper strata.

8. The packaged semiconductor device of claim 1, wherein
the plurality of beads comprises beads formed from a material that has a slower rate of media diffusion than the polymeric gel.

9. The packaged semiconductor device of claim 1, wherein
the plurality of beads comprises beads having one or more shapes of a group of shapes including spheres, hollow spheres, cylindrical shapes, hollow cylindrical shapes, rectangular box shapes, hollow rectangular box shapes, and toroidal shapes.

10. The packaged semiconductor device of claim 1, further comprising:
a substrate embedded in the package body; and
a semiconductor die attached to the substrate and embedded in the package body, wherein
the substrate is one of a group including a laminate substrate and a lead frame.

11. The packaged semiconductor device of claim 1, further comprising:
a lid attached to a top surface of the package body, wherein the lid includes a vent hole.

12. A method for fabricating a packaged semiconductor device, the method comprising:
assembling a semiconductor die and a substrate as part of a device structure;
encapsulating the device structure using film assisted molding to form a mold body having a recess;
attaching a pressure sensor to an attachment surface exposed within the recess;
injecting a low viscosity polymeric gel into the recess, wherein
the low viscosity polymeric gel comprises a plurality of beads distributed within the low viscosity polymeric gel; and
curing the low viscosity polymeric gel into a high viscosity polymeric gel, wherein
the plurality of beads float toward a top surface of the low viscosity polymeric gel as the low viscosity polymeric gel is cured into the high viscosity polymeric gel, and
the plurality of beads become embedded in a top region of the high viscosity polymeric gel.

13. The method of claim 12, wherein
each bead of the plurality of beads further comprises a metal coating.

14. The method of claim 12, wherein
a density of each bead of the plurality of beads is less than a density of the low viscosity polymeric gel.

15. The method of claim 12, wherein
before the curing, the low viscosity polymeric gel has an initial viscosity that reduces movement of the plurality of beads distributed within the low viscosity polymeric gel, and
during an initial curing stage, the initial viscosity is reduced to release the plurality of beads distributed within the low viscosity polymeric gel.

16. The method of claim 12, further comprising:
during the curing, vibrating the device structure to encourage self-arrangement of the plurality of beads near the top surface of the low viscosity polymeric gel.

17. A method for fabricating a packaged semiconductor device, the method comprising:
assembling a semiconductor die and a substrate as part of a device structure;
encapsulating the device structure using film assisted molding to form a mold body having a recess;
attaching a pressure sensor to an attachment surface exposed within the recess;
injecting a low viscosity polymeric gel into the recess;
curing the low viscosity polymeric gel into an intermediate viscosity polymeric gel;
dispensing a plurality of beads onto a top surface of the intermediate viscosity polymeric gel, wherein
the plurality of beads sink below a top surface of the intermediate viscosity polymeric gel; and
curing the intermediate viscosity polymeric gel into a high viscosity polymeric gel, wherein
the plurality of beads become embedded in a top region of the high viscosity polymeric gel.

18. The method of claim 17, wherein
a density of each bead of the plurality of beads is greater than a density of the intermediate viscosity polymeric gel.

19. The method of claim 17, further comprising:
vibrating the device structure to encourage self-arrangement of the plurality of beads near the top surface of the intermediate viscosity polymeric gel.

20. The method of claim 17, wherein
each bead of the plurality of beads further comprises a metal coating.

* * * * *